US010451236B2

(12) United States Patent
Jo

(10) Patent No.: US 10,451,236 B2
(45) Date of Patent: Oct. 22, 2019

(54) LAMP FOR VEHICLE AND VEHICLE HAVING THE SAME

(71) Applicant: LG Electronics Inc., Seoul (KR)

(72) Inventor: Juung Jo, Seoul (KR)

(73) Assignee: LG Electronics Inc., Seoul (KR)

(*) Notice: Subject to any disclaimer, the term of this patent is extended or adjusted under 35 U.S.C. 154(b) by 104 days.

(21) Appl. No.: 15/857,013

(22) Filed: Dec. 28, 2017

(65) Prior Publication Data

US 2018/0363872 A1 Dec. 20, 2018

(30) Foreign Application Priority Data

Jun. 14, 2017 (KR) .................. 10-2017-0074988

(51) Int. Cl.
F21S 41/141 (2018.01)
F21S 43/14 (2018.01)
F21S 45/47 (2018.01)
F21S 41/24 (2018.01)
F21S 41/33 (2018.01)
F21S 43/249 (2018.01)
F21S 43/31 (2018.01)
F21S 41/20 (2018.01)
F21S 43/20 (2018.01)
(Continued)

(52) U.S. Cl.
CPC ............ *F21S 41/141* (2018.01); *F21S 41/24* (2018.01); *F21S 41/285* (2018.01); *F21S 41/33* (2018.01); *F21S 43/14* (2018.01); *F21S 43/249* (2018.01); *F21S 43/26* (2018.01); *F21S 43/31* (2018.01); *F21S 45/47* (2018.01); *F21V 5/004* (2013.01); *B60Q 1/0088* (2013.01); *B60Q 1/04* (2013.01); *B60Q 1/20* (2013.01); *B60Q 1/30* (2013.01); *B60Q 1/34* (2013.01); *F21S 41/657* (2018.01); *F21Y 2107/60* (2016.08); *F21Y 2115/10* (2016.08); *H01L 25/0753* (2013.01); *H01L 25/0756* (2013.01); *H01L 33/505* (2013.01); *H01L 33/507* (2013.01); *H01L 33/60* (2013.01); *H01L 33/62* (2013.01)

(58) Field of Classification Search
CPC ........ F21S 41/141; F21S 41/285; F21S 41/33; F21S 41/24; F21S 43/249; F21S 43/31; F21S 43/26; F21S 45/47; F21V 5/004
See application file for complete search history.

(56) References Cited

U.S. PATENT DOCUMENTS

2017/0327030 A1* 11/2017 Kim ................. B60Q 1/115
2017/0361759 A1* 12/2017 Kim ................. B60Q 1/08

FOREIGN PATENT DOCUMENTS

DE 102010041114 3/2012
EP 2690343 1/2014
(Continued)

OTHER PUBLICATIONS

European Search Report in European Application No. 18177295.5, dated Nov. 12, 2018, 9 pages.

*Primary Examiner* — David V Bruce
(74) *Attorney, Agent, or Firm* — Fish & Richardson P.C.

(57) ABSTRACT

A lamp for a vehicle includes a light generation unit configured to generate light, and a lens configured to change an optical path of light generated by the light generation unit. The light generation unit includes a plurality of array modules arranged in a stacked configuration in which each array module includes a plurality of micro Light Emitting Diode (LED) devices.

20 Claims, 16 Drawing Sheets

(51) Int. Cl.
    *F21V 5/00*     (2018.01)
    *F21Y 107/60*     (2016.01)
    *F21Y 115/10*     (2016.01)
    *F21S 41/657*     (2018.01)
    *B60Q 1/00*     (2006.01)
    *B60Q 1/04*     (2006.01)
    *B60Q 1/20*     (2006.01)
    *B60Q 1/30*     (2006.01)
    *B60Q 1/34*     (2006.01)
    *H01L 25/075*     (2006.01)
    *H01L 33/50*     (2010.01)
    *H01L 33/60*     (2010.01)
    *H01L 33/62*     (2010.01)

(56) References Cited

FOREIGN PATENT DOCUMENTS

| | | |
|---|---|---|
| JP | 3181145 | 7/2001 |
| JP | 2006351351 A | 12/2006 |
| JP | 2008153093 A | 7/2008 |
| JP | 2014522083 A | 8/2014 |
| TW | M543321 U | 6/2017 |
| WO | 2013/083819 | 6/2013 |
| WO | 2016/009061 | 1/2016 |
| WO | 2016/209792 | 12/2016 |

* cited by examiner

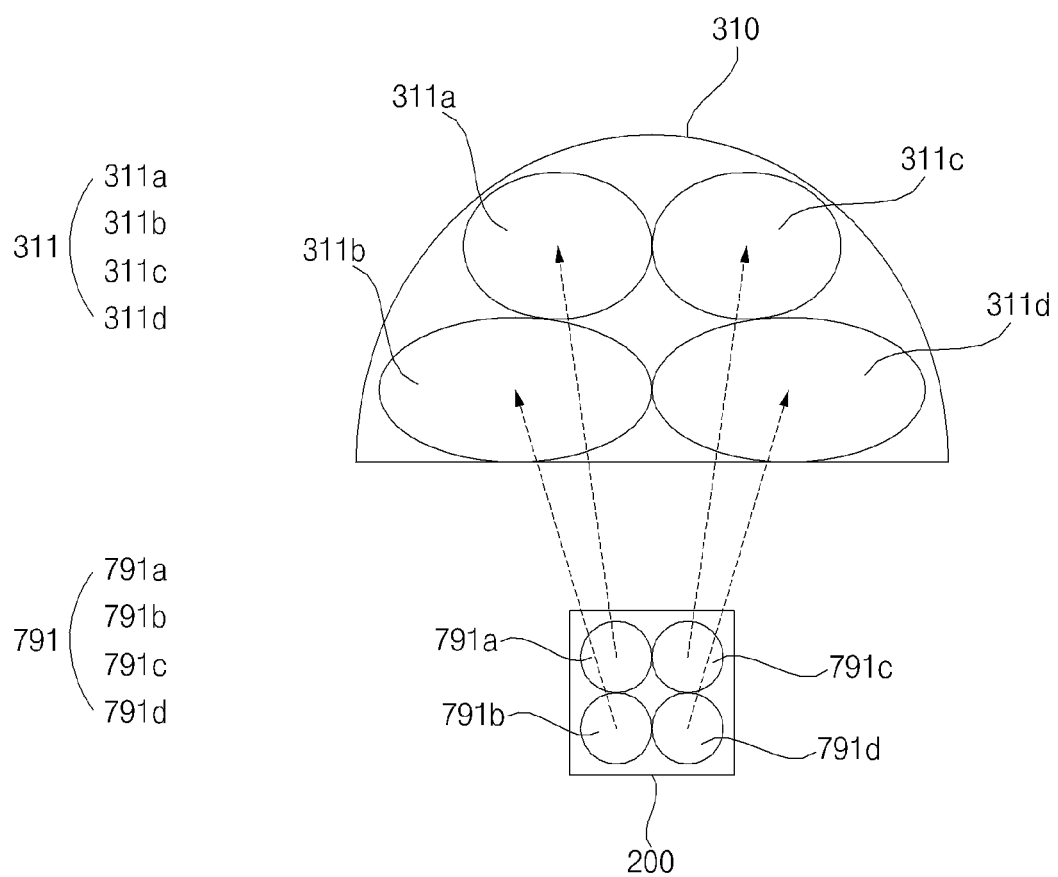

LAMP FOR VEHICLE AND VEHICLE HAVING THE SAME

CROSS-REFERENCE TO RELATED APPLICATION

This application claims the priority benefit of Korean Patent Application No. 10-2017-0074988, filed on Jun. 14, 2017, in the Korean Intellectual Property Office, the disclosure of which is incorporated herein by reference.

FIELD

The present disclosure relates to a lamp for a vehicle, and a vehicle including a lamp.

BACKGROUND

A vehicle is an apparatus that a user can ride in a direction. An example of a vehicle may be an automobile.

The vehicle includes lamps. For example, the vehicle includes a head lamp, a rear combination lamp, and a fog lamp.

The lamps for a vehicle may be classified as lamps for providing visibility for a driver (e.g., a head lamp and a fog lamp), and lamps for notifying a signal (e.g., a rear combination lamp).

Various elements may be used as light sources of the lamps provided in a vehicle.

Recently, there have been efforts to utilize a plurality of micro Light Emitting Diode (LED) devices as light sources of the lamps for a vehicle.

In some examples, output power of a single micro LED device may be limited. In some cases, a vehicle lamp using micro LED devices may not provide a sufficient light amount.

SUMMARY

One object of the present disclosure may be to provide a lamp for a vehicle, which utilizes micro Light Emitting Diode (LED) devices that can provide a sufficient amount of light.

Another object of the present disclosure may be to provide a vehicle including the aforementioned lamp.

Objects of the present disclosure should not be limited to the aforementioned objects and other unmentioned objects will be clearly understood by those skilled in the art from the following description.

According to one aspect of the subject matter described in this application, a lamp for a vehicle includes a light generation unit configured to generate light, and a lens configured to change an optical path of light generated by the light generation unit. The light generation unit includes a plurality of array modules in which each array module includes a plurality of micro Light Emitting Diode (LED) devices, where the plurality of array modules are arranged in a stacked configuration.

Implementations according to this aspect may include one or more of the following features. For example, each of the plurality of array modules may include a first array module including a first group of micro LED devices disposed in a first pattern, and a second array module including a second group of micro LED devices disposed in a second pattern that is different from the first pattern, where the first array module and the second array module are arranged in the stacked configuration. In some examples, the light generation unit may further include a phosphor layer configured to change a wavelength of a first light generated by the first group of micro LED devices, and to change a wavelength of a second light generated by the second group of micro LED devices.

In some implementations, the first group of micro LED devices may include a plurality of micro LED devices that are spaced apart from each other by a first interval, and the second group of micro LED devices may include a plurality of micro LED devices that are spaced apart from each other by the first interval. In some examples, the second group of micro LED devices may be offset from the first group of micro LED devices in a first direction or a second direction that is orthogonal to the first direction. In some examples, the lamp may include a plurality of first wires configured to supply power to the first array module, and a plurality of second wires configured to supply power to the second array module, where the plurality of first wires are offset from the plurality of second wires.

In some implementations, the plurality of array modules may be stacked with one another along a horizontal direction, and the plurality of array modules is configured to output light toward the lens. In some examples, the lamp may further include a light guide that comprises a plurality of optical waveguides, where the plurality of optical waveguides are configured to lead, toward the lens, light generated by one or more micro LED devices of the plurality of array modules.

In some implementations, the lamp may further include a reflector, where the plurality of array modules are stacked along a vertical direction, and configured to output, toward the reflector, light generated by the plurality of array modules. In some examples, the reflector may include a plurality of reflection facets configured to reflect light from the plurality of micro LED devices, and a number of the plurality of reflection facets is based on a density of the plurality of micro LED devices.

In some examples, the lamp may further include a Micro Lens Array (MLA) configured to direct a first portion of light generated by the plurality of array modules toward a first portion of the plurality of reflection facets, and direct a second portion of light generated by the plurality of array modules toward a second portion of the plurality of refection facets. The plurality of array modules may include a first plurality of array modules that are stacked at a first side of an optical axis of the lens, and a second plurality of array modules that are stacked at a second side of the optical axis that is different than the first side.

In some implementations, the lamp may further include a cooling device configured to dissipate heat generated from the light generation unit, and a bracket connected to the cooling device and configured to support the plurality of array modules, the bracket comprising a metal material. The lamp may further include a thermal conductive adhesive configured to couple the plurality of array modules to the bracket. The plurality of micro LED devices may include an electrode comprising a metal material, and the cooling device may be configured to dissipate heat that is transferred from the light generation unit through the electrode, the thermal conductive adhesive, and the bracket.

In some examples, the cooling device may extend in a direction parallel to an optical axis of the lens, and the plurality of array modules may include a first plurality of array modules that are stacked at a first side of the cooling device, and a second plurality of array modules that are stacked at a second side of the cooling device that is different than the first side.

In some implementations, the light generation unit may further include a base that supports the plurality of array modules, and the base comprises a hole configured to pass light generated by the plurality of array modules passes. In some examples, each of the plurality of array modules may include a transparent electrode. In some examples, the first plurality of array modules may be configured to output light toward a portion of the reflector disposed at the first side of the optical axis, and the second plurality of array modules may be configured to output light toward a portion of the reflector disposed at the second side of the optical axis.

According to another aspect of the subject matter, a vehicle includes the lamp that includes one or more of the features described above. For example, a vehicle includes a plurality of wheels, a power source configured to drive a rotation of at least one of the plurality of wheels, and a lamp for the vehicle. The lamp for the vehicle includes a light generation unit configured to generate light, and a lens configured to change an optical path of light generated by the light generation unit. The light generation unit includes a plurality of array modules, where each array module includes a plurality of micro Light Emitting Diode (LED) devices, and the plurality of array modules are arranged in a stacked configuration.

The details of other implementations are included in the following description and the accompanying drawings.

The implementations of the present disclosure have one or more effects as follows.

First, a plurality of array modules are stacked, an amount of light may improve.

Second, as micro LED devices are disposed in a different pattern in each of the stacked array modules, an amount of light loss may be minimized.

Third, as a cooling system is provided, it may be possible to process heat generated from the plurality of array modules stacked with one another.

Effects of the present disclosure should not be limited to the aforementioned effects and other unmentioned effects will be clearly understood by those skilled in the art from the claims.

BRIEF DESCRIPTION OF THE DRAWINGS

FIGS. 7A to 7E are diagrams illustrating example structures in which an example plurality of array modules are stacked in a vertical direction.

DETAILED DESCRIPTION

Figure 1:
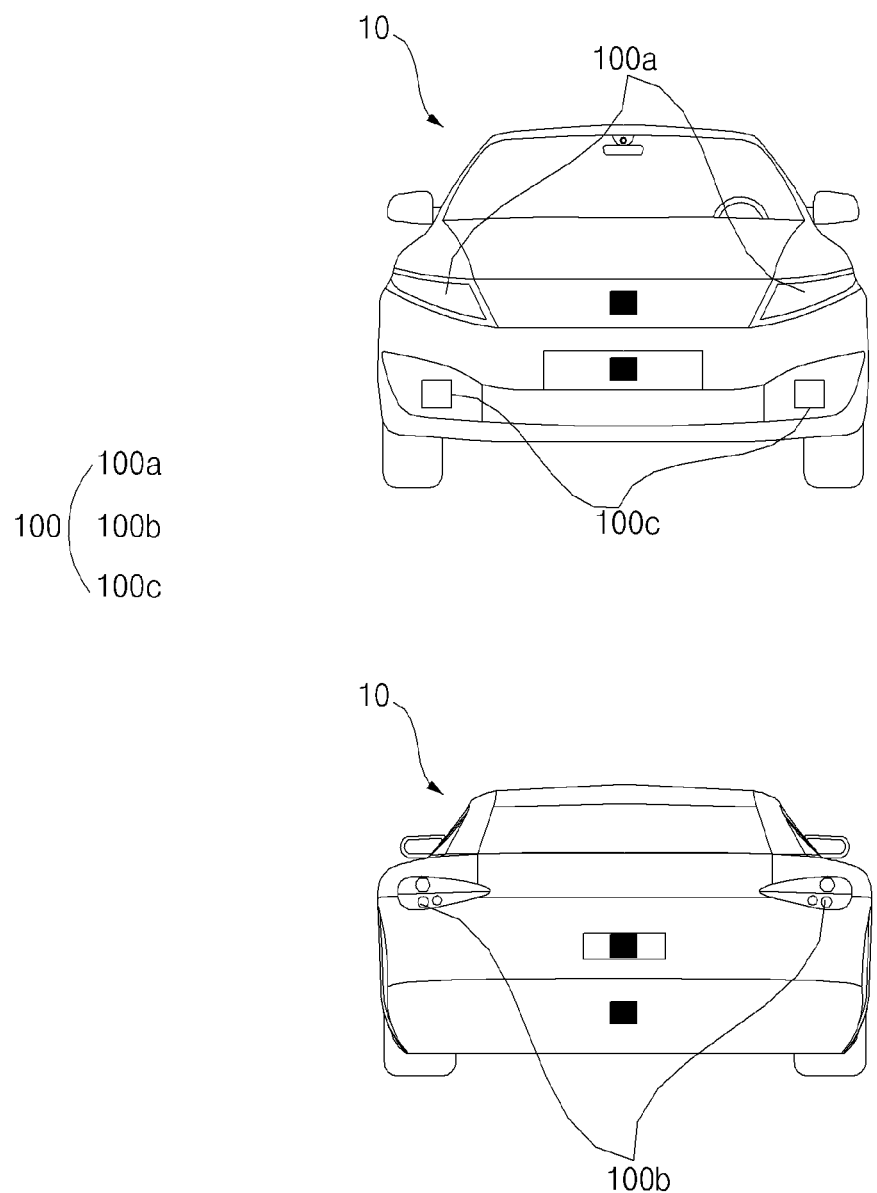
FIG. 1 is a diagram illustrating an example exterior appearance of an example vehicle.

The example implementations disclosed in the present specification will be described in detail with reference to the accompanying drawings, and the same or similar elements are denoted by the same reference numerals even though they are depicted in different drawings and redundant descriptions thereof will be omitted.

A vehicle as described in this specification may include an automobile, a motorcycle, other types of vehicles. Hereinafter, a description will be given based on an automobile.

A vehicle as described in this specification may include all of an internal combustion engine vehicle including an engine as a power source, a hybrid vehicle including both an engine and an electric motor as a power source, and an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

In this specification, arrangement of micro LED devices and transfer of micro LED devices may be used interexchangeable with each other.

FIG. 1 is a diagram illustrating an example exterior appearance of an example vehicle.

Referring to FIG. 1, a vehicle 10 may include a lamp 100 for vehicle.

The lamp 100 may include a head lamp 100a, a rear combination lamp 100b, and a fog lamp 100c.

The lamp 100 may further include a room lamp, a turn signal lamp, a daytime running lamp, a back lamp, and a positioning lamp.

The term "overall length" means the length from the front end to the rear end of the vehicle 10, the term "overall width" means the width of the vehicle 10, and the term "overall height" means the height from the bottom of the wheel to the roof. In the following description, the term "overall length direction L" may mean the reference direction for the measurement of the overall length of the vehicle 10, the term "overall width direction W" may mean the reference direction for the measurement of the overall width of the vehicle 10, and the term "overall height direction H" may mean the reference direction for the measurement of the overall height of the vehicle 10.

Figure 2:
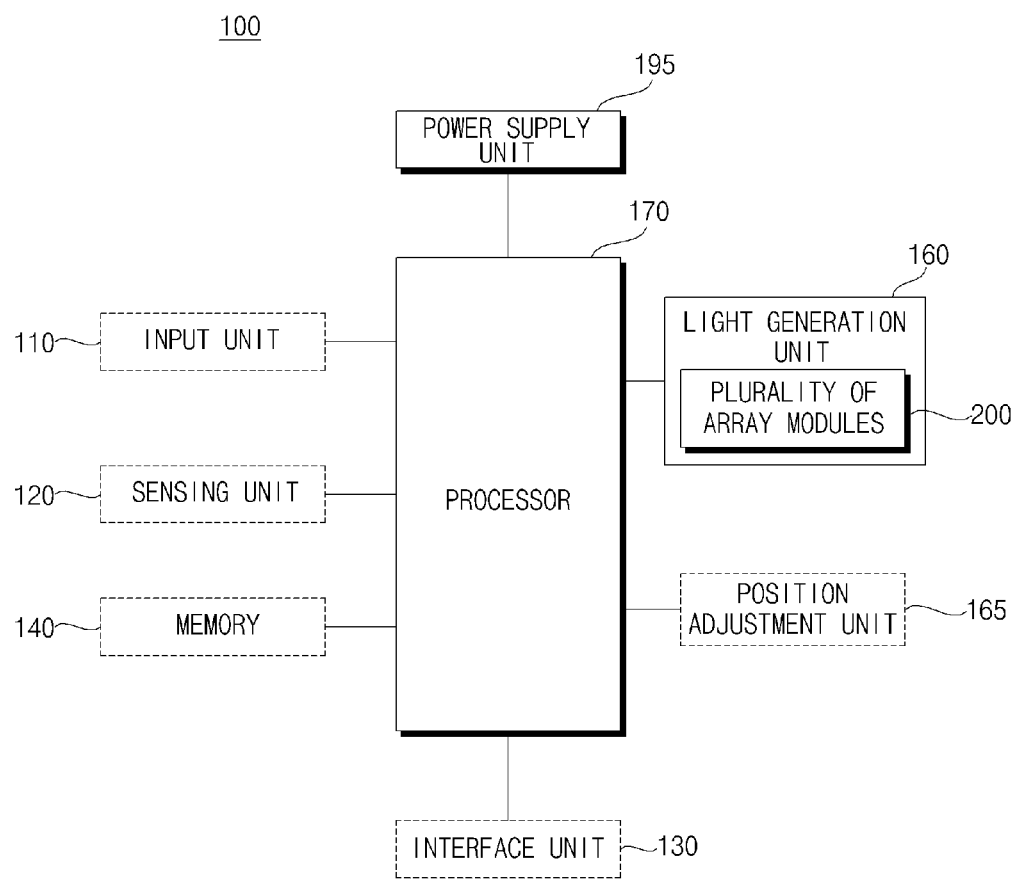
FIG. 2 is a block diagram of an example lamp for a vehicle.

FIG. 2 is a block diagram illustrating an example lamp for a vehicle.

Referring to FIG. 2, the lamp 100 may include a light generation unit 160, a processor 170, and a power supply unit 190.

The lamp 100 may further include an input unit 110, a sensing unit 120, an interface unit 130, a memory 140, and a position adjustment unit 165 individually or in combination.

The input unit 110 may receive a user input for controlling the lamp 100.

The input unit 110 may include one or more input devices. For example, the input unit 110 may include one or more of a touch input device, a mechanical input device, a gesture input device, and a voice input device.

The input unit 110 may receive a user input for controlling operation of the light generation unit 160.

For example, the input unit 110 may receive a user input for controlling turning on or off of the light generation unit 160.

The sensing unit 120 may include one or more sensors.

For example, the sensing unit 120 may include a temperature sensor or an illumination sensor.

The sensing unit 120 may acquire temperature information of the light generation unit 160.

The sensing unit 120 may acquire external illumination information of the vehicle 10.

The interface unit 130 may exchange information, data, or a signal with another device provided in the vehicle 10.

The interface unit 130 may transmit information, data, or a signal, received from another device provided in the vehicle 10, to the processor 170.

The interface unit 130 may transmit information, data, or a signal, generated by the processor 170, to another device provided in the vehicle 10.

The interface unit 130 may receive driving situation information.

The driving situation information may include at least one of: information on an object located outside of the vehicle 10, navigation information, or vehicle state information.

The information on an object located outside of the vehicle 10 may include: information on the presence of the object, information on a location of the object, information on movement of the object, information on a distance between the vehicle 10 and the object, information on a speed of the vehicle 10 relative to the object, and information on a type of the object.

The object information may be generated by an object detection apparatus provided in the vehicle 10. The object detection apparatus may detect an object based on sensing data generated by one or more sensors of: a camera, a radar, a LIDAR, an ultrasonic sensor, and an infrared sensor.

The object may include a line, a nearby vehicle, a pedestrian, a two-wheeled vehicle, a traffic signal, a light, a road, a structure, a bump, a geographical feature, and an animal.

The navigation information may include at least one selected from among map information, information on a set destination, information on a route to the set destination, and information on various object located along the route, lane information, and information on the current location of the vehicle 10.

The navigation information may be generated by a navigation apparatus provided in the vehicle 10.

The vehicle state information may include vehicle position information, vehicle speed information, vehicle tilt information, vehicle weight information, vehicle direction information, vehicle battery information, vehicle fuel information, vehicle tire pressure information, vehicle steering information, in-vehicle temperature information, in-vehicle humidity information, pedal position information, vehicle engine temperature information, etc.

The vehicle state information may be generated based on sensing information of various sensors provided in the vehicle 10.

The memory 140 may store basic data for each unit of the lamp 100, control data for the operational control of each unit of the lamp 100, and input/output data of the lamp 100.

The memory 140 may be any of various hardware storage devices, such as a ROM, a RAM, an EPROM, a flash drive, and a hard drive.

The memory 140 may store various data for the overall operation of the lamp 100, such as programs for the processing or control of the processor 170.

The memory 140 may be a subordinate element of the processor 170.

Under the control of the processor 170, the light generation unit 160 may convert electrical energy into light energy.

The light generation unit 160 may include a plurality of array modules 200 on which a plurality of micro Light Emitting Diode (LED) devices is disposed.

The plurality of array modules 200 may be stacked with each other.

A micro LED device may refer to an LED chip of a few micro-meter. For example, the size of a micro LED device may be 5 to 15 um.

A micro LED device may be transferred onto a substrate.

The array module 200 may include a substrate and a subarray in which the plurality of micro led devices is disposed. The array module 200 may include one or more subarrays.

The subarray may be in any of various shapes.

For example, the subarray may be in a shape of a figure having a predetermined area.

For example, the subarray may have a circular shape, a polygonal shape, or a fan shape.

In some example, the substrate may include a Flexible Copper Clad Laminated (FCCL) substrate.

A base 911 (see FIG. 6) and a second anode 912 (see FIG. 6) may form a substrate.

The position adjustment unit 165 may adjust a position of the light generation unit 160.

The position adjustment unit 165 may control the light generation unit 160 to be tilted. Due to the tilting control of the light generation unit 160, output light may be adjusted in an up-down direction (e.g., the overall height direction).

The position adjustment unit 165 may control the light generation unit 160 to be panned. Due to the panning control of the light generation unit 160, output light may be adjusted in a left-right direction (e.g., the overall width direction).

The position adjustment unit 165 may further include a driving force generation unit (e.g., a motor, an actuator, and a solenoid) that provides a driving force to adjust a position of the light generation unit 160.

When the light generation unit 160 generates a low beam, the position adjustment unit 165 may adjust a position of the light generation unit 160 downward further than when the light generation unit 160 generates a high beam.

When the light generation unit 160 generates a high beam, the position adjustment unit 165 may adjust a position of the light generation unit 160 upward further than when the light generation unit 160 generates a low beam.

The processor 170 may be electrically connected to each unit of the lamp 100. The processor 170 may control overall operation of each unit of the lamp 100.

The processor 170 may control the light generation unit 160.

By adjusting an amount of electrical energy supplied to the light generation unit 160, the processor 170 may control the light generation unit 160.

The processor 170 may control the plurality of array modules 200 on a region basis.

For example, the processor 170 may control the plurality of array modules 200 on a region basis in a manner of supplying a different amount of electrical energy to micro LED devices disposed on each region of the plurality of array modules 200.

The processor 170 may control the plurality of array module 200 on a layer basis.

For example, the processor 170 may control the plurality of array modules 200 on a layer basis in a manner of supplying a different amount of electrical energy to micro LED devices disposed in each layer of the plurality of array modules 200.

Under the control of the processor 170, the power supply unit 190 may supply electrical energy to each unit of the lamp 100. For example, the power supply unit 190 may be supplied with power from a battery inside the vehicle 10.

Figure 3:
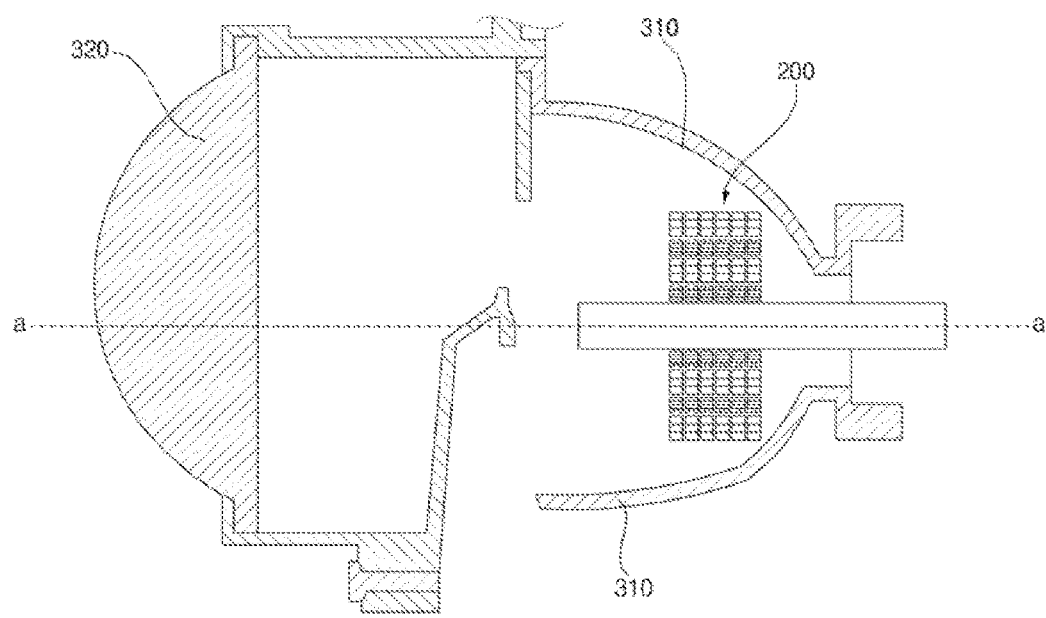
FIG. 3 is a diagram illustrating an example lamp for a vehicle.

FIG. 3 is a diagram illustrating an example lamp for a vehicle.

In FIG. 3, a head lamp is illustrated as an exemplary lamp for the vehicle 10.

Referring to FIG. 3, a lamp 100 for a vehicle may include a light generation unit 160, a reflector 310, and a lens 320.

The reflector 310 reflects light generated by the light generation unit 160. The reflector 310 induces the light to be emitted toward an area in front of or behind the vehicle 10.

The reflector 310 may be made of aluminum (Al) or silver (Ag) material having decent reflectance, or may be coated on a reflective surface.

The lens 320 is disposed in front of the light generation unit 160 and the reflector 310. The lens 320 allows light, generated by the light generation unit 160 or reflected by the reflector 310, to be refracted and pass therethrough. The lens 320 may be an aspheric lens.

The lens 320 may change an optical path of light generated by the light generation unit 160.

Figure 4:
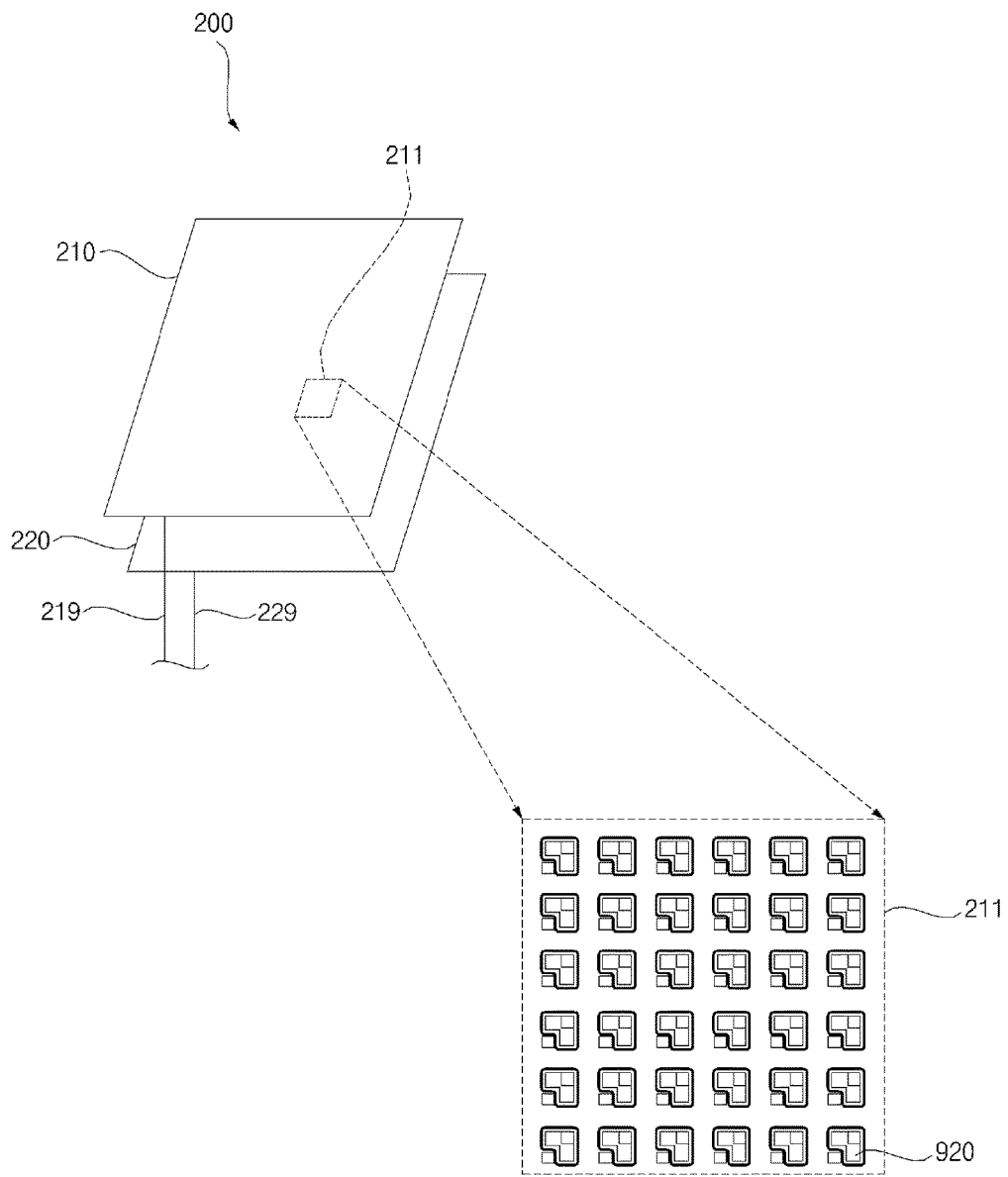
FIG. 4 is a diagram illustrating an example plurality of array modules.

FIG. 4 is a diagram illustrating an example plurality of array modules.

Referring to FIG. 4, the light generation unit 160 may include a plurality of array modules 200 in which a plurality of micro LED devices is disposed.

For example, the light generation unit 160 may include a first array module 210 and a second array module 220.

The first array module 210 may be different from the second array module 220 in terms of at least one of: an interval for a plurality of micro LED devices, positions of a plurality of micro LED devices in each array module, or a density of a plurality of micro LED devices.

The second array module 220 may be different from the first array module 210 in terms of at least one of: an interval for a plurality of micro LED devices, positions of a plurality of micro LED devices in each array module, or a density of a plurality of micro LED devices.

The density of the plurality of micro LED devices indicates the number of micro LED devices per unit area.

In the first array module 210, a first group of micro LED devices may be disposed in a first pattern.

The first pattern may be determined by at least one of: an interval for the micro LED devices included in the first group, position of the micro LED devices included in the first group in an array module, or a density of the micro LED devices included in the first group.

A plurality of micro LED devices included in the first array module 210 may be disposed at a first interval.

The plurality of micro LED devices included in the first group may be disposed at the first interval.

In the second array module 220, a second group of micro LED devices may be disposed in a second pattern different from the first pattern.

The second pattern may be determined by at least one of: an interval for the micro LED devices included in the second group, position of the micro LED devices included in the second group in an array module, or a density of the micro LED devices included in the second group.

The plurality of micro LED devices included in the second array module 220 may be disposed at an interval as the same as the interval at which the plurality of micro LED devices included in the first array module 210 is disposed.

The plurality of micro LED devices included in the second group may be disposed at an interval as the same as the interval at which the plurality of micro LED devices included in the first group is disposed.

That is, the plurality of micro LED devices included in the second group may be disposed at the first interval.

The plurality of micro LED devices included in the second group may be disposed not to overlap in a vertical or horizontal direction with the plurality of micro LED devices included in the first group.

For example, the first group of micro LED devices may be disposed in the first array module 210 not to overlap with the second group of micro LED devices when the first array module 210 and the second array module 220 overlapping with each other is viewed from above.

For example, the second group of micro LED devices may be disposed in the second array module 220 not to overlap with the first group of micro LED devices when the second array module 220 and the first array module 210 stacked with each other are viewed from above. In other words, the second group of micro LED devices are offset from the first group of micro LED devices in a first direction or a second direction that is orthogonal to the first direction. For example, projection lines of the second group of micro LED devices may be offset from projection lines of the first ground of micro LED devices when the first and second array modules 210 and 220 are stacked.

Due to such arrangement, it is possible to minimize intervention from the first group of micro LED devices in output power of the second group of micro LED devices.

In some implementations, the light generation unit 160 may include three or more array modules.

Figure 5A:
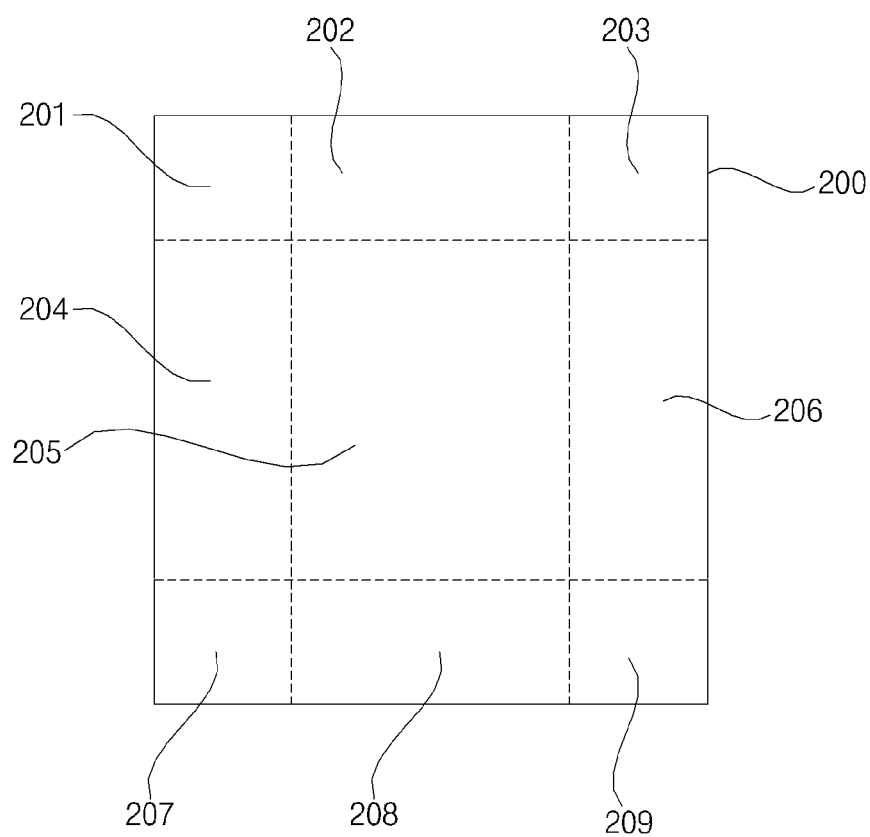
FIG. 5A illustrates an exemplary top view of a plurality of array modules overlapping with each other.

FIG. 5A illustrates an exemplary top view of an example plurality of array modules overlapping with each other.

Figure 5B:
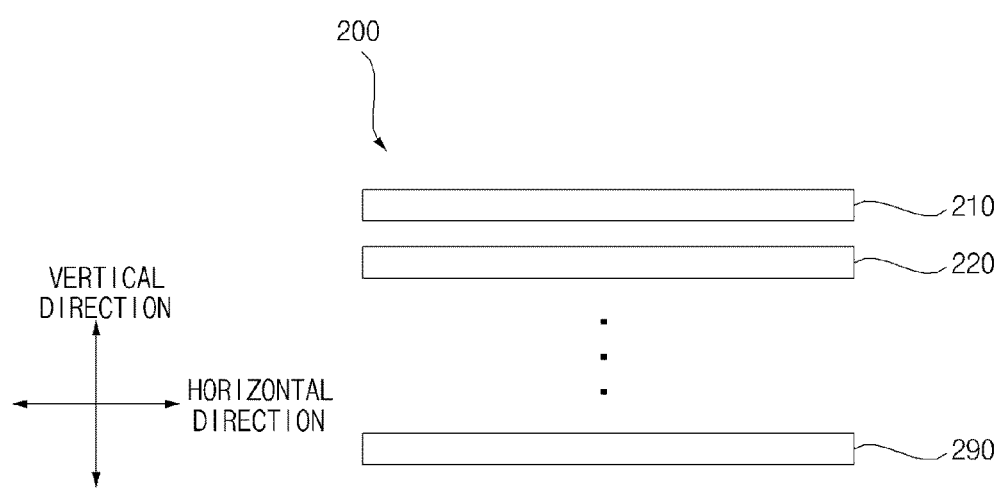
FIG. 5B illustrates an exemplary side view of the plurality of array modules overlapping with each other.

FIG. 5B illustrates an exemplary side view of the plurality of array modules overlapping with each other.

Referring to FIGS. 5A and 5B, the processor 170 may control regions 201 to 209 on the plurality of array modules 200 individually. The regions 201 to 209 shown in FIG. 5A may be defined in each layer 210 to 290 shown in FIG. 5B of the plurality of array modules 200.

The processor 170 may adjust a light distribution pattern for each region of the plurality of array modules 200 individually.

The plurality of array modules 200 may be divided into a plurality of regions 201 to 209.

The processor 270 may adjust an amount of electrical energy to be supplied to each of the plurality of regions 201 to 209.

The processor 170 may control layers of the plurality of array modules 200 individually.

The processor 270 may adjust an amount of light of output power for each layer of the plurality of array modules 200.

The plurality of array modules 200 may be composed of a plurality of layers. The plurality of layers may be composed of the plurality of array modules 200, respectively.

For example, a first layer for the plurality of array modules 200 may be formed by a first array module, and a second layer for the plurality of array modules 200 may be formed by a second array module.

The processor 270 may adjust an amount of electrical energy to be supplied to each of the plurality of layers.

Figure 6:
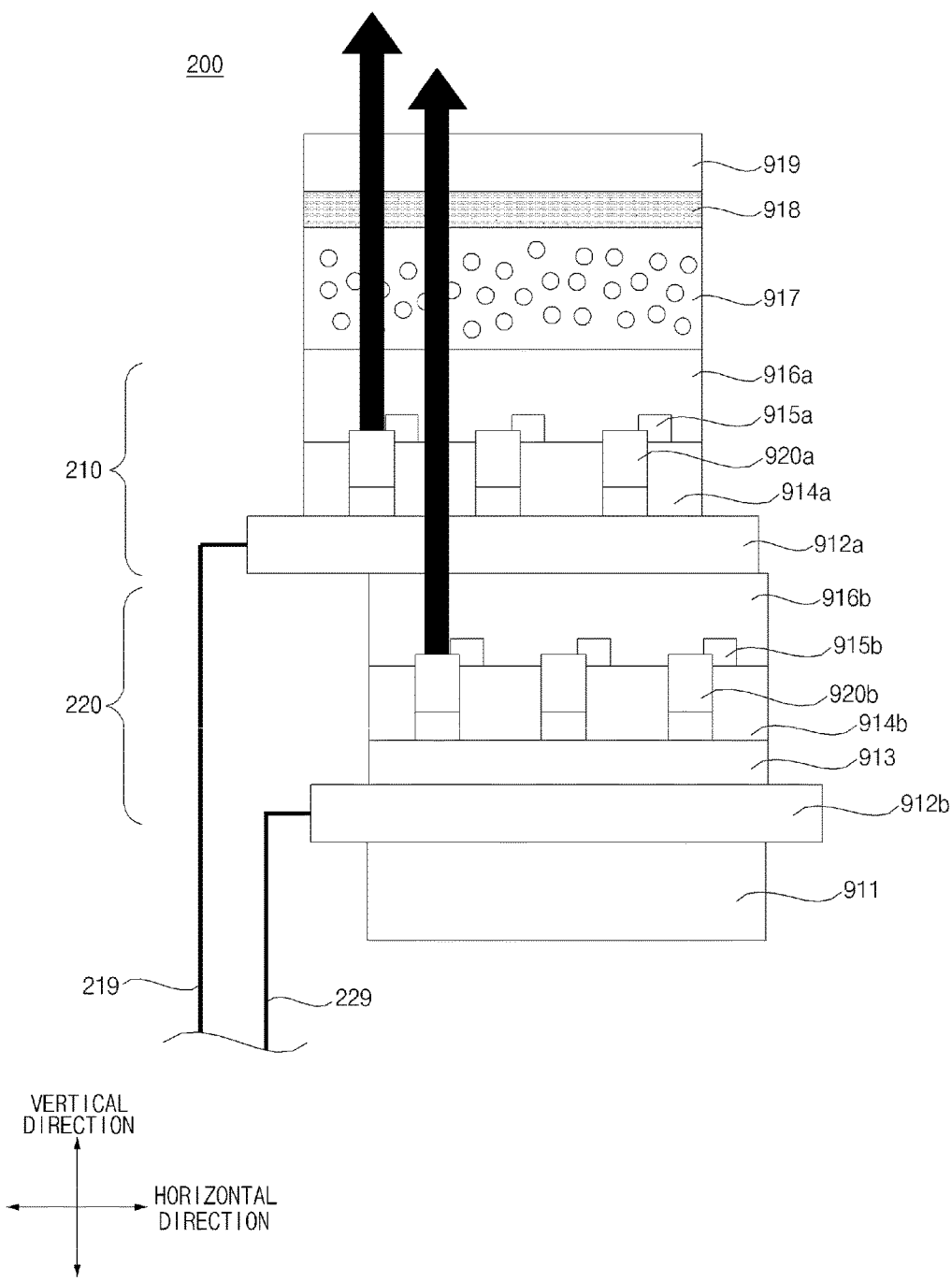
FIG. 6 is a diagram illustrating an example plurality of array module in which example micro LED devices are disposed.

FIG. 6 is a diagram illustrating an example plurality of array module in which micro LED devices are disposed.

FIG. 6 illustrates a first array module 210 and a second array module 220 included the plurality of array modules 200. However, the plurality of array modules 200 may include three or more array modules.

Referring to FIG. 6, the plurality of array module 200 may include a base 911, the first array module 210, and the second array module 220.

In some implementations, the plurality of array modules 200 may further include a phosphor layer 917, a color filter film 918, and a cover film 919 in combination or individually.

In some examples, the plurality of array modules 200 may include a single phosphor layer 917 that receives light from the plurality of array modules 200 that are stacked.

The base 911 may be made of polyimide (PI). In some examples, the base 911 may be a flexible printed circuit board (PCB).

The second array module 220 may be formed on the base 911.

The second array module 220 may be transferred onto the base 911.

The second array module 220 may be formed between the first array module 210 and the base 911.

The second array module 220 may include a second anode 912b, a reflective layer 913, a second inter-layer dielectric film 914b, a second group of micro LED devices 920b, a second optical spacer 916b, and a second cathode 915b.

The second anode 9112 and the second cathode 915b may be light transmissive electrodes.

The second anode 912b and the second cathode 915b may be referred to as transparent electrodes.

The second array module 220 may include a transparent electrode.

The second anode 912b and the second cathode 915b may include at least one metal material or a combination of metal materials, including but not limited to nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The second anode 912b may be formed between the base 911 and the reflective layer 913.

The second cathode 915b may be formed on the second inter-layer dielectric film 914b.

The reflective layer 913 may be formed on the second anode 912b. The reflective layer 913 may reflect light generated by a plurality of micro LED devices 920. The reflective layer 913 may be made of silver (Ag), for instance.

The second inter-layer dielectric film 914b may be formed on the reflective layer 913.

The second group of micro LED devices 920b may be formed on the second anode 912b. Each of the micro LED devices 920b included in the second group may be attached to the reflective layer 913 or the second anode 912b using a solder material or an Anisotropic Conductive Film (ACF).

The second optical spacer 916b may be formed on the second inter-layer dielectric film 914b. The optical spacer 916b is used to keep the second group of micro LED devices 920b and the first array module 210 at a distance from each other, and the optical spacer 916b may be made of an insulating material.

The first array module 210 may be formed on the second array module 220.

The first array module 210 may include a first anode 912a, a first inter-layer dielectric film 914a, a first group of micro LED devices 920a, a first optical spacer 916a, and a first cathode 915a.

The first anode 912a and the first cathode 915a may be light-transmissive electrodes.

The first anode 912a and the first cathode 915a may be referred to as transparent electrodes.

The first array module 210 may include a transparent electrode.

The first anode 912a and the first cathode 915a may include at least one metal material or a combination of metal materials, including but not limited to nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The first anode 912a may be formed between the second optical spacer 916b and the first inter-layer dielectric film 914a.

The first cathode 915a may be formed on the first inter-layer dielectric film 914a.

The first inter-layer dielectric film 914a may be formed on the first anode 912a.

The first group of micro LED devices 920a may be formed on the first anode 912a. Each of the micro LED devices 920a included in the first group may be attached to the first anode 912a using a solder material or an Anisotropic Conductive Film (ACF).

The first optical spacer 916a may be formed on the first inter-layer dielectric film 914a. The optical spacer 916a is used to keep the first group of micro LED devices 920a and the phosphor layer 917 at a distance from each other, and the optical spacer 916a may be made of an insulating material.

The phosphor layer 910 may be formed on the first array module 210 and the second array module 220.

The phosphor layer 917 may be formed on the first optical spacer 916a. The phosphor layer 917 may be formed of resin in which phosphorus is evenly distributed. Depending on a wavelength of light emitted from the first and second groups of micro LED devices 920a and 920b, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor.

The phosphor layer 917 may change wavelengths of lights emitted from the micro LED devices 920a and 920b of the first and second groups.

The phosphor layer 917 may change a wavelength of a first light generated by the first group of micro LED devices 920a, and a wavelength of a second light generated by the second group of micro LED devices 920b.

The first color filter film 918 may be formed on the phosphor layer 917. The color filter film 918 may realize a specific color for light which has passed through the phosphor layer 917. The color filter film 918 may realize color that is any one of red (R), green (G), blue (B), or a combination thereof.

The cover film 919 may be formed on the color filter film 918. The cover film 919 may protect the plurality of array modules 200.

The plurality of micro LED devices 920b included in the second array module 220 may be disposed not to overlap in a vertical or horizontal direction with the plurality of micro LED devices 920a included in the first array module 210.

The plurality of micro LED devices 920b included in the second group may be disposed not to overlap in a vertical or horizontal direction with the plurality of micro LED devices 920a included in the first group.

A vertical direction may be a direction in which the plurality of array modules 200 is stacked.

The first and second groups of micro LED devices 920a and 920b may output light in the vertical direction.

A horizontal direction may be a direction in which the first and second groups of micro LED devices 920a and 920b.

The horizontal direction may be a direction in which the base 911, the first and second anodes 912a and 912b, or the phosphor layer 917 extends.

The lamp 100 may further include a wire via which power is supplied to the plurality of array modules 200.

For example, the lamp 100 may include a first wire 219 and a second wire 229.

Via the first wire 219, power may be supplied to the first array module 210. The first wire 219 may consist of a pair of wires. The first wire 219 may be connected to the first anode 912a and/or the first cathode 915a.

Via the second wire 229, power may be supplied to the second array module 220. The second wire 229 may consist of a pair of wires. The second wire 229 may be connected to the second anode 912b and/or the second cathode 915b.

The first wire 219 and the second wire 229 may be disposed not to overlap with each other.

FIGS. 7A to 7E are diagrams illustrating example structures in which a plurality of array modules are stacked in a vertical direction.

Figure 7A:
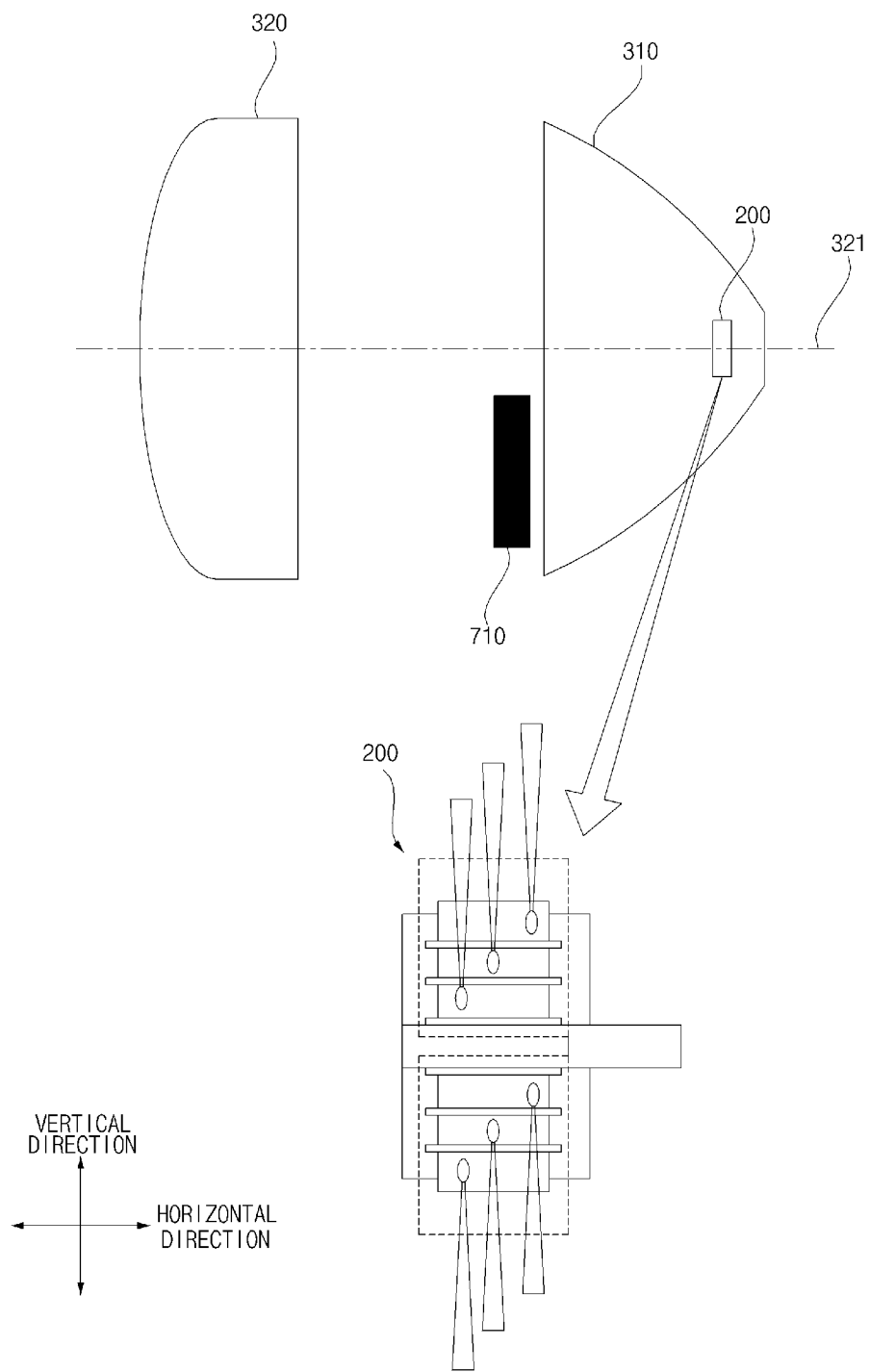

Referring to FIG. 7A, the lamp 100 may include a light generation unit 160, a reflector 310, and a lens 320.

The light generation unit 160 may include a plurality of array modules 200.

The plurality of array modules 200 may be disposed to be stacked in a vertical direction (e.g., an up-down direction).

The vertical direction may be defined as a direction vertical to the ground.

For example, the vertical direction may indicate an overall height direction of the vehicle 10.

The plurality of array modules 200 may be stacked in a direction vertical to an optical axis 321 of the lens 320.

The plurality of array module may be stacked in a vertical direction with respect to the optical axis 321 of the lens 320.

Due to this structure, it is possible to secure a greater amount of light.

Light generated by the plurality of array modules 200 may be output toward the reflector 310.

Light reflected by the reflector 310 may pass through the lens 320 and be then emitted to the outside of the vehicle 10.

The lamp 100 may further include a shield 710.

The shield 710 may output part of light generated by the light generation unit 160.

The shield 710 may be used to prevent glaring of an opposing driver.

Figure 7B:
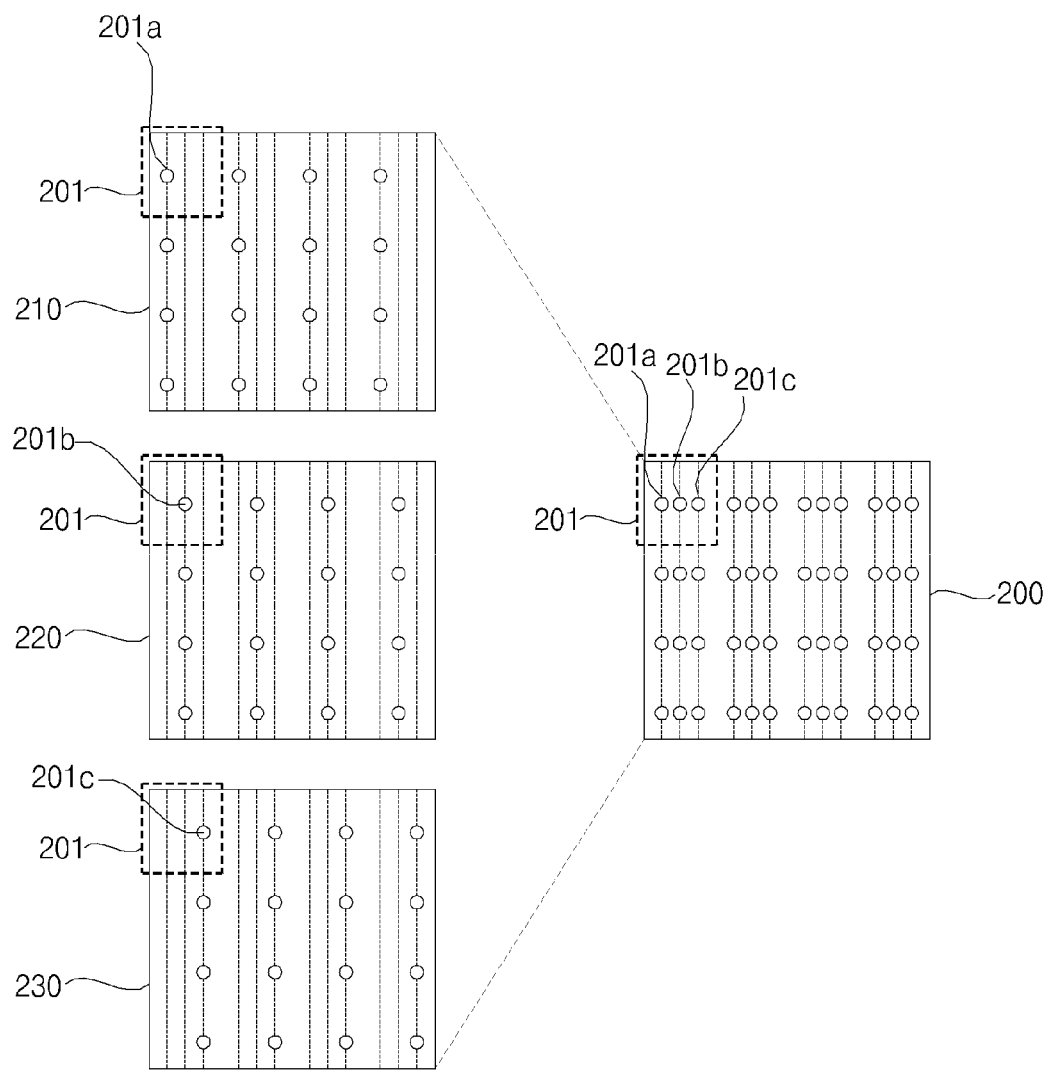

FIG. 7B illustrates the plurality of array modules 200 viewed from above.

Referring to FIG. 7B, the plurality of array modules 200 may include a first array module 210, a second array module 220, and a third array module 230.

Using light generated by at least one among the first to third array modules 210, 220, and 230, the lamp 100 may function as a head lamp, a rear combination lamp, a fog lamp, a turn signal lamp, etc.

The number of array modules stacked with one another and included in the plurality of array modules 200 may be determined based on which lamp the lamp 100 functions as and how much amount of light is required.

A plurality of micro LED devices may be disposed in a first region 201 in the plurality of array modules 200.

The number of micro LED devices disposed in the first region 201 may be the sum of micro LED devices in the first region 201 of each of the plurality of array modules 200.

For example, three micro LED devices may be disposed in the first region 201. In this case, the micro LED devices disposed in the first region 201 may consist of a first micro LED device 201a, a second micro LED device 201b, and a third micro LED device 201c.

The first micro LED device 201a may be disposed in the first location of the first array module 210.

The second micro LED device 201b may be disposed in the second location of the second array module 220.

The third micro LED device 201c may be disposed in the third location of the third array module 230.

In some examples, a plurality of micro LED devices disposed in each of the plurality of array modules 200 may be disposed at the same interval.

The plurality of micro LED devices disposed in each of the plurality of array modules 200 may be disposed at different positions in the same region.

That is, the plurality of micro LED devices disposed in each of the plurality of array modules 200 may be disposed not to overlap with one another, when viewed from above.

For example, the first micro LED device 201a may be disposed at a first position in the first region 201 of the first array module 210.

For example, the second micro LED device 201b may be disposed at a second position in the first region 201 of the second array module 220. The second position is different from the first position.

For example, the third micro LED device 201c may be disposed at a third position in the first region 201 of the third array module 230. The third position is different from the first position and the second position.

The first region of the first array module 210, the first region of the second array module 220, and the first region of the third array module 230 may be described as the same region when the first, second, and third array modules 210, 220, and 230 are stacked and viewed from above.

Figure 7D:
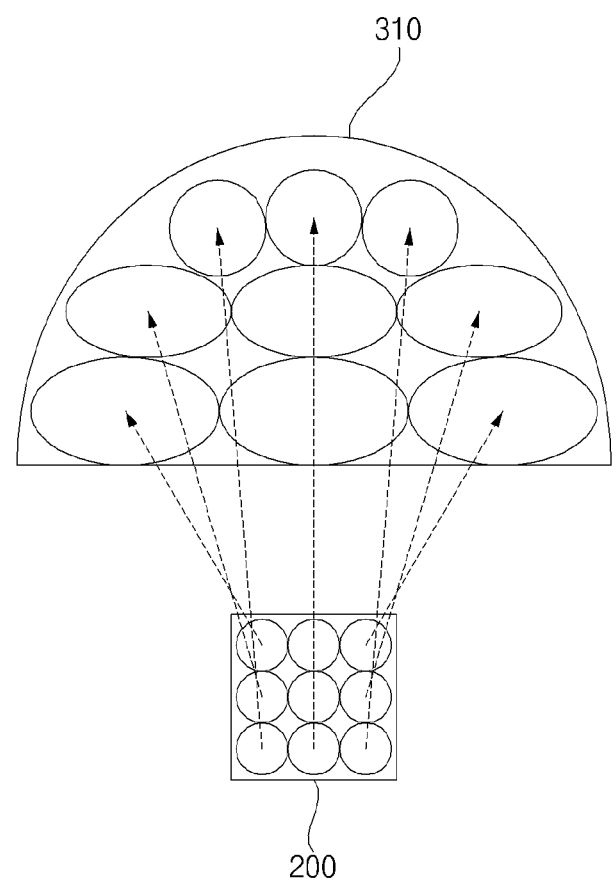

FIGS. 7C and 7D are diagram illustrating example reflectors.

Referring to FIGS. 7C and 7D, the reflector 310 may include a plurality of reflection facets.

The plurality of reflection facets 311 may be formed based on a density of a plurality of micro LED devices. The density may be defined as the number of micro LED devices disposed per unit area in the plurality of array modules 200. For example, a number of the reflection facets 311 may be determined based on the density of the micro LED devices.

The reflector 310 may include a plurality of reflection facets corresponding to a plurality of regions 791 into which the plurality of array modules 200 is divided by a reference density.

The reflector 310 may include reflection facets 311 whose number corresponds to the plurality of regions 791 into which the plurality of array modules 200 is divided by a reference density.

As illustrated in FIG. 3, the plurality of array modules 200 may be divided into first to fourth regions 791a, 791b, 791c, and 791d by a first density value. In this case, the reflector 310 may include first to fourth reflection facets 311a, 311b, 311c, and 311d which respectively correspond to the first to fourth regions 791a, 791b, 791c, and 791d.

In some examples, the reflection facets 311a to 311d may be angled differently.

The plurality of reflection facets 311 may be respectively disposed at optimal positions at which lights are induced to be reflected toward the lens 320 from the plurality of regions 791 of the plurality of array modules 200, where the plurality of regions 791 respectively correspond to the plurality of reflection facets 311.

The plurality of reflection facets 311 may be respectively formed at positions on which lights respectively generated by the regions 791 of the reflector 310 are focused.

For example, the first reflection facet 311a may be formed at a first position of the reflector 310 on which light generated by the first region 791a is focused.

For example, the second reflection facet 311b may be formed at a second position of the reflector 310 on which light generated by the second region 791b is focused.

For example, the third reflection facet 311c may be formed at a third position of the reflector 310, on which light generated by the third region 791c is focused.

For example, the fourth reflection facet 311d may be formed at a fourth position of the reflector 310 on which light generated by the fourth region 791d is focused.

Each of the plurality of reflection facets 311 may be concave-shaped with respect to the plurality of array modules 200, so that lights generated by each of the regions 791 of the reflector 310 is reflected toward the lens 320 without any light loss.

As illustrated in FIG. 7D, the plurality of array modules 200 may be divided into first to ninth regions by a first density value. In this case, the reflector 310 may include first to ninth reflection facets respectively corresponding to the first to ninth regions.

Figure 7E:
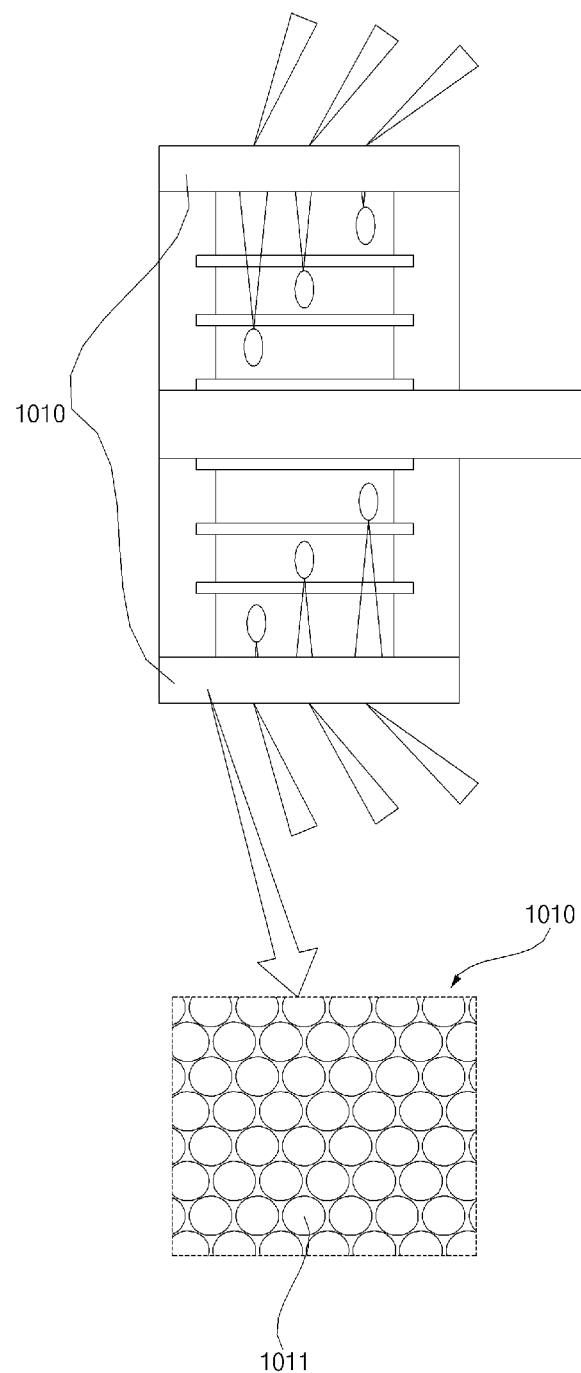

FIG. 7E is a diagram illustrating an example Micro Lens Array (MLA) module.

Referring to FIG. 7E, the lamp 100 may further include a Micro Lens Array (MLA) 1010.

The MLA 1010 may be disposed on the plurality of array modules 200.

For example, the MLA 1010 may be disposed on the phosphor layer 917, the color filter film 918, or the cover film 919.

The MLA 1010 may be formed based on a density of the plurality of micro LED devices.

The MLA 1010 may include a plurality of sub-lenses 1011 respectively corresponding to a plurality of regions 791 (see FIG. 7E) into which the plurality of array module 200 is divided by a reference density.

The MLA 1010 may include sub-lenses 1011, whose number corresponds to the number of plurality of regions 791 into which the plurality of array modules 200 is divided by the reference density.

The MLA 1010 may be formed such that the plurality of sub-lenses 1011 is respectively positioned on a plurality of optical paths generated by the plurality of regions 791.

The MLA 1010 may induce light, generated by the plurality of array modules 200, toward the reflector 310.

The MLA 1010 may induce a plurality of lights, which is generated by the plurality of array modules 200, toward a plurality of reflection facets 311, individually.

For example, the plurality of array modules 200 may include a first region and a second region. The MLA 1010 may include a first sub-lens and a second sub-lens. The reflector 310 may include a first reflection facet and a second reflection facet.

A first light generated by the first region may be induced by the first sub-les and then incident on the first reflection facet. The first light incident on the first reflection facet may be reflected and then incident on the lens 320.

A second light generated by the second region may be induced by the second sub-lens and then incident on the second reflection facet. The second light incident on the second reflection facet may be reflected and then incident on the lens 320.

Figure 8:
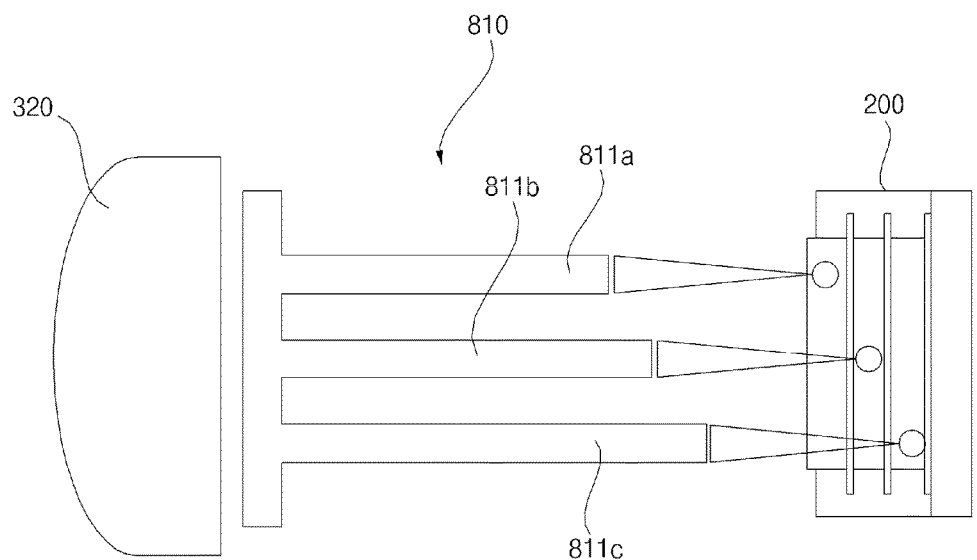
FIG. 8 is a diagram illustrating an example structure in which an example plurality of array modules are stacked in a horizontal direction.
Figure 8:
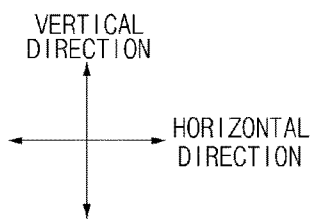

FIG. 8 is a diagram illustrating an example structure in which a plurality of array modules is stacked in a horizontal direction.

Referring to FIG. 8A, the lamp 100 may include a light generation unit 160, a light guide 810, and a lens 320.

The light generation unit 160 may include a plurality of array modules 200.

The plurality of array modules 200 may be stacked with one another in a horizontal direction (e.g., a front-rear direction).

The horizontal direction may be defined as a direction parallel to the ground.

"Being parallel" does not indicate a meaning in mathematics, but may be understood as an expression used to explain a location, a direction, and a position in a space.

The plurality of array modules 200 may be stacked in a direction of an optical axis 321 of the lens 320.

Light generated by the plurality of array modules 200 may be output toward the lens 320.

The light guide 810 may guide the light, generated by the plurality of array modules 200, toward the lens 320.

The light guide 810 may include a plurality of optical fiber branches 811.

The number of optical fiber branches 811a, 811b, and 811c may be determined based on the number of regions into which the plurality of array modules 200 is divided by a density of micro LED devices. The optical fiber branches may be waveguides that are configured to lead, toward the lens, light generated by one or more micro LED devices included in the plurality of array modules 200.

The plurality of optical fiber branches 811a, 811b, and 811c may induce light, generated by one or more micro LED devices included in the plurality of array modules 200, toward the lens 320.

In example examples, the lamp 100 may further include a shield.

The shield may prevent part of the light generated by the light generation unit 160.

The shield may be used to prevent glare on an opposing driver.

Figure 9A:
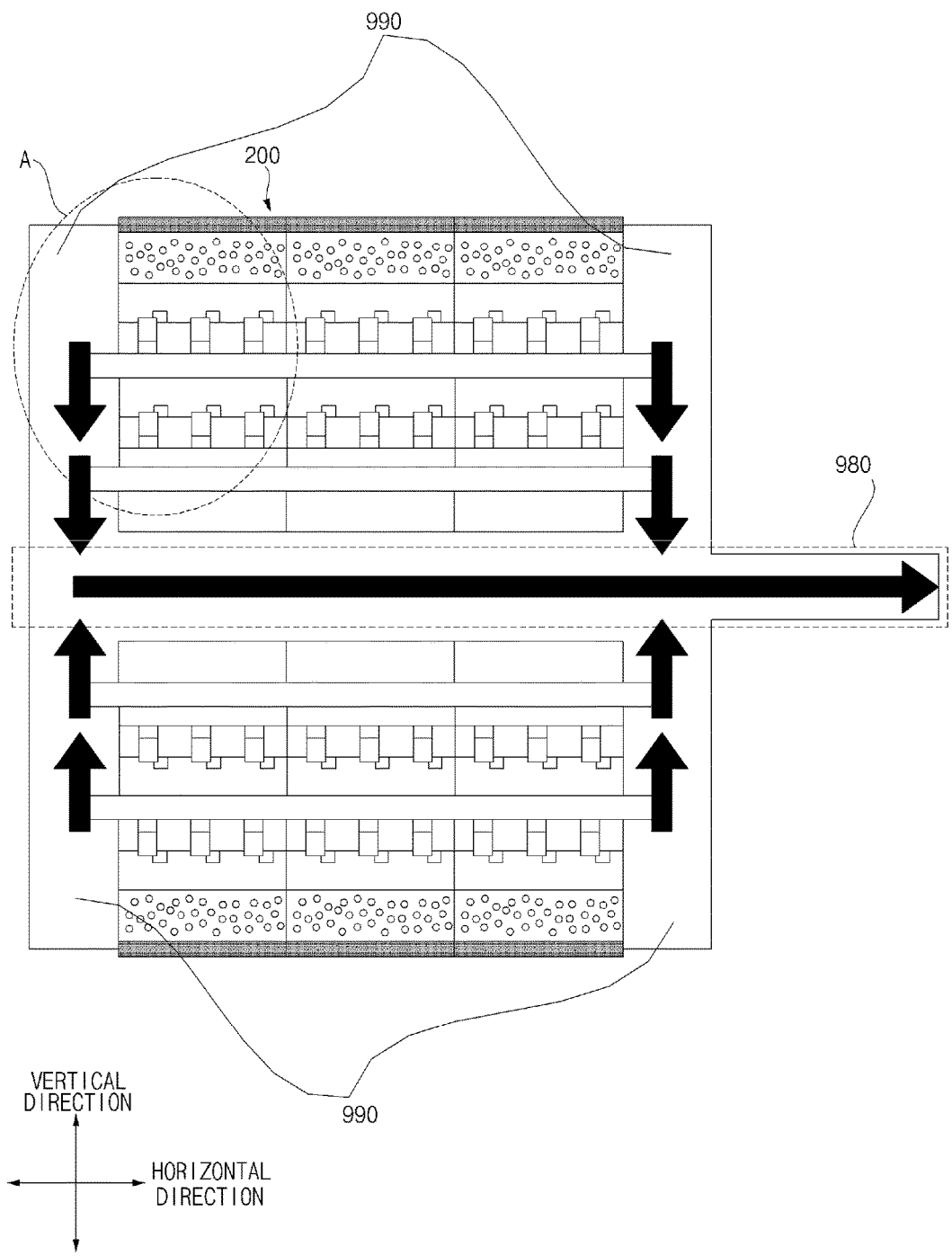
FIGS. 9A and 9B are diagrams illustrating an example cooling system.
Figure 9B:
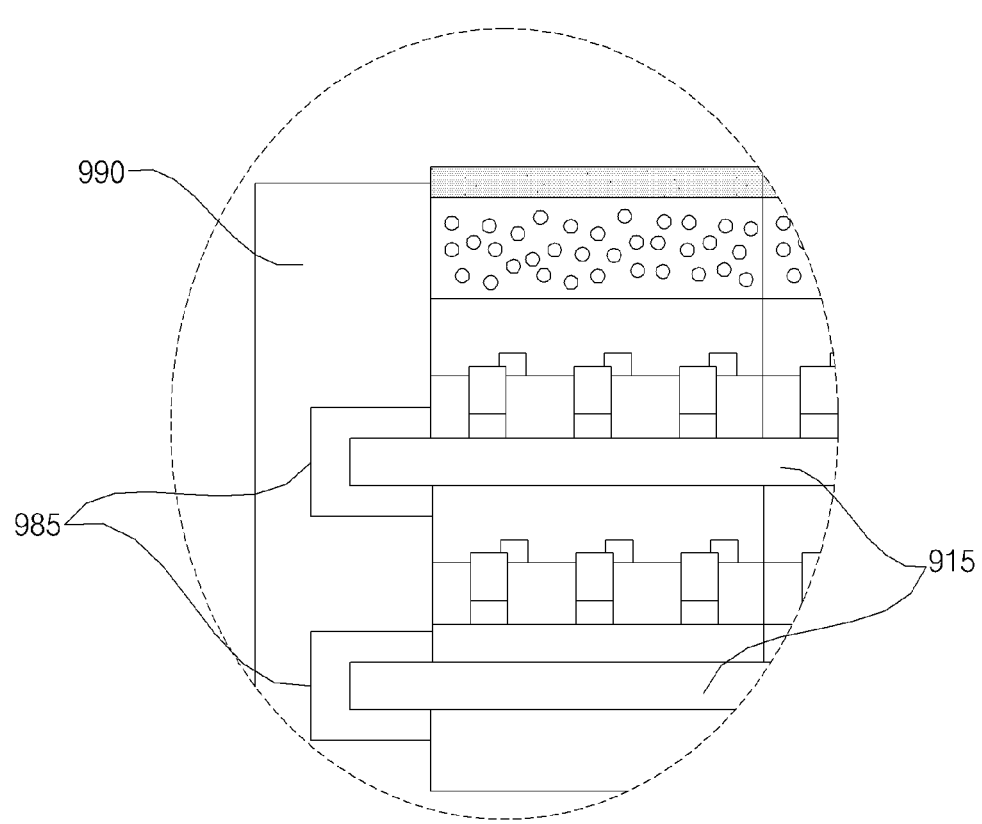

FIGS. 9A and 9B are diagrams illustrating an example cooling system. In some examples, the cooling system may include a cooling device such as a heat sink, Peltier elements, a fan, a water cooling device, an air cooling device, etc.

Referring to FIG. 9A, the lamp 100 may further include a cooling system 980 and a bracket 990.

The cooling system 980 may process heat generated in the light generation unit 160.

The cooling system 980 may utilize a water cooling method or an air cooling method.

The bracket 990 may fix the plurality of array modules 200. The bracket 990 may be made of a metal material.

A plurality of micro LED devices 920a and 920b (see in FIG. 6) may include electrodes made of a metal material.

The electrodes may be anodes 912a and 921b or cathodes 915a and 915b which are described above with reference to FIG. 6.

The bracket 990 may be connected to the anodes 912a and 912b (see FIG. 6) or the cathodes 915a and 915b (see FIG. 6) included in each of the plurality of array modules 200.

FIG. 9B is an enlarged version of a portion A of FIG. 9A.

Referring to FIG. 9B, the lamp 100 may further include a thermal conductive adhesive 985.

The thermal conductive adhesive 985 may allow the plurality of array modules 200 to be attached to the bracket 990.

The thermal conductive adhesive 985 may transfer heat from the electrodes 915 to the bracket 990.

Heat generated in the light generation unit 160 may be transferred to the cooling system 980 through the thermal conductive adhesive 985 and the bracket 990.

The bracket 990 may be connected to the cooling system 980.

The bracket 990 may transfer heat, which is generated when light is generated by the plurality of array modules 200, to the cooling system 980.

Again, referring back to FIG. 9A, the cooling system 980 may be disposed in parallel with an optical axis of the lens 320.

The plurality of array modules 200 may be stacked with one another above and below the cooling system 980.

As the plurality of array modules 200 are stacked above and below the cooling system 980, it is possible to secure a sufficient output power and efficiently processing heat.

Figure 10:
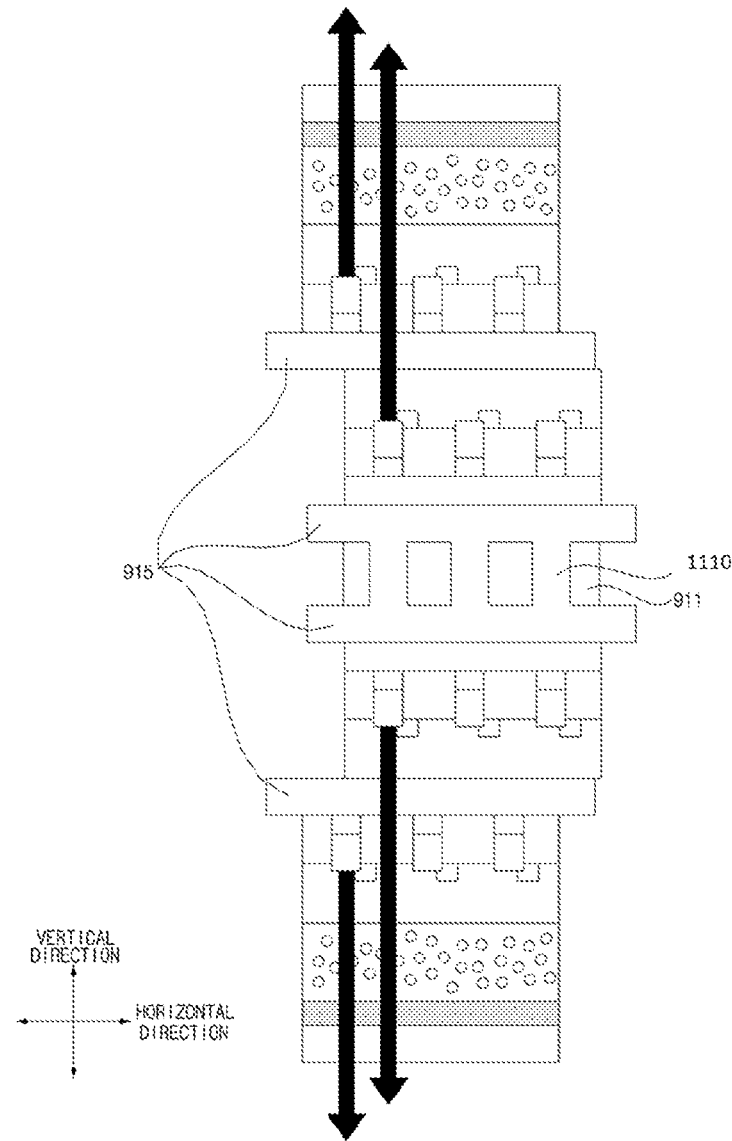
FIG. 10 is a diagram illustrating an example plurality of array modules.

FIG. 10 is a diagram illustrating an example plurality of array modules.

Referring to FIG. 10, the plurality of array modules 200 each may include a transparent electrode 915.

The transparent electrode 915 may include a cathode 915a or 915b shown in FIG. 6.

The light generation unit 160 may include a base 911 on which the plurality of array modules 200 is disposed.

The base 911 may include a hole 1110 through which light generated by the plurality of array modules 200 passes. In some examples, light reflected from a first side of the reflector may pass through the hole 1110 and propagate toward a second side that is opposite to the first side with respect to the optical axis of the lens.

As illustrated in FIG. 10, the light generation unit 160 may include the plurality of array modules 200 which is disposed above and below the base 911.

As one or more holes 1110 are formed on the base 911, light, which is generated by a plurality of array modules disposed above the base 911 and travels downward, may be induced in a direction toward a reflector positioned below the base 911. As a result, light efficiency improves.

As one or more holes 1110 are formed on the base 911, light, which is generated by a plurality of array modules disposed below the base 911 and travels upward, may be induced in a direction toward a reflector positioned above the base 911. As a result, light efficiency improves.

The present disclosure as described above may be implemented as code that can be written on a computer-readable medium in which a program is recorded and thus read by a computer. The computer-readable medium includes all kinds of recording devices in which data is stored in a computer-readable manner. Examples of the computer-readable recording medium may include a hard disk drive (HDD), a solid state disk (SSD), a silicon disk drive (SDD), a read only memory (ROM), a random access memory (RAM), a compact disk read only memory (CD-ROM), a magnetic tape, a floppy disc, and an optical data storage device. In addition, the computer-readable medium may be implemented as a carrier wave (e.g., data transmission over the Internet). In addition, the computer may include a processor or a controller. Thus, the above detailed description should not be construed as being limited to the implementations set forth herein in all terms, but should be considered by way of example. The scope of the present disclosure should be determined by the reasonable interpretation of the accompanying claims and all changes in the equivalent range of the present disclosure are intended to be included in the scope of the present disclosure.

Although implementations have been described with reference to a number of illustrative implementations thereof, it should be understood that numerous other modifications and implementations can be devised by those skilled in the art that will fall within the spirit and scope of the principles of this disclosure. For example, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lamp for a vehicle, comprising:
   a light generation unit configured to generate light; and
   a lens configured to change an optical path of light generated by the light generation unit,
   wherein the light generation unit comprises a plurality of array modules, each array module comprising a plurality of micro Light Emitting Diode (LED) devices, and
   wherein the plurality of array modules are arranged in a stacked configuration.

2. The lamp according to claim 1, wherein each of the plurality of array modules comprises:
   a first array module including a first group of micro LED devices disposed in a first pattern; and
   a second array module including a second group of micro LED devices disposed in a second pattern that is different from the first pattern, and
   wherein the first array module and the second array module are arranged in the stacked configuration.

3. The lamp according to claim 2, wherein the light generation unit further comprises a phosphor layer configured to change a wavelength of a first light generated by the first group of micro LED devices, and to change a wavelength of a second light generated by the second group of micro LED devices.

4. The lamp according to claim 2, wherein the first group of micro LED devices comprises a plurality of micro LED devices that are spaced apart from each other by a first interval, and
   wherein the second group of micro LED devices comprises a plurality of micro LED devices that are spaced apart from each other by the first interval.

5. The lamp according to claim 2, wherein the second group of micro LED devices are offset from the first group of micro LED devices in a first direction or a second direction that is orthogonal to the first direction.

6. The lamp according to claim 2, further comprising:
   a plurality of first wires configured to supply power to the first array module; and
   a plurality of second wires configured to supply power to the second array module,
   wherein the plurality of first wires are offset from the plurality of second wires.

7. The lamp according to claim 1, wherein the plurality of array modules is stacked with one another along a horizontal direction, and wherein the plurality of array modules is configured to output light toward the lens.

8. The lamp according to claim 7, further comprising a light guide that comprises a plurality of optical waveguides,
wherein the plurality of optical waveguides are configured to lead, toward the lens, light generated by one or more micro LED devices of the plurality of array modules.

9. The lamp according to claim 1, further comprising a reflector,
wherein the plurality of array modules are stacked along a vertical direction, and configured to output, toward the reflector, light generated by the plurality of array modules.

10. The lamp according to claim 9, wherein the reflector comprises a plurality of reflection facets configured to reflect light from the plurality of micro LED devices,
wherein a number of the plurality of reflection facets is based on a density of the plurality of micro LED devices.

11. The lamp according to claim 10, further comprising a Micro Lens Array (MLA) configured to:
direct a first portion of light generated by the plurality of array modules toward a first portion of the plurality of reflection facets, and
direct a second portion of light generated by the plurality of array modules toward a second portion of the plurality of refection facets.

12. The lamp according to claim 9, wherein the plurality of array modules comprise a first plurality of array modules that are stacked at a first side of an optical axis of the lens, and a second plurality of array modules that are stacked at a second side of the optical axis that is different than the first side.

13. The lamp according to claim 1, further comprising:
a cooling device configured to dissipate heat generated from the light generation unit; and
a bracket connected to the cooling device and configured to support the plurality of array modules, the bracket comprising a metal material.

14. The lamp according to claim 13, further comprising a thermal conductive adhesive configured to couple the plurality of array modules to the bracket.

15. The lamp according to claim 14, wherein the plurality of micro LED devices comprise an electrode comprising a metal material, and
wherein the cooling device is configured to dissipate heat that is transferred from the light generation unit through the electrode, the thermal conductive adhesive, and the bracket.

16. The lamp according to claim 13, wherein the cooling device extends in a direction parallel to an optical axis of the lens, and
wherein the plurality of array modules comprise a first plurality of array modules that are stacked at a first side of the cooling device, and a second plurality of array modules that are stacked at a second side of the cooling device that is different than the first side.

17. The lamp according to claim 1, wherein the light generation unit further comprises a base that supports the plurality of array modules, and
wherein the base comprises a hole configured to pass light generated by the plurality of array modules passes.

18. The lamp according to claim 1, wherein each of the plurality of array modules comprises a transparent electrode.

19. The lamp according to claim 12, wherein the first plurality of array modules are configured to output light toward a portion of the reflector disposed at the first side of the optical axis, and
wherein the second plurality of array modules are configured to output light toward a portion of the reflector disposed at the second side of the optical axis.

20. A vehicle comprising:
a plurality of wheels;
a power source configured to drive a rotation of at least one of the plurality of wheels; and
a lamp for the vehicle comprising:
a light generation unit configured to generate light, and
a lens configured to change an optical path of light generated by the light generation unit,
wherein the light generation unit comprises a plurality of array modules, each array module comprising a plurality of micro Light Emitting Diode (LED) devices, and
wherein the plurality of array modules are arranged in a stacked configuration.

* * * * *